(12) United States Patent
Galera et al.

(10) Patent No.: US 7,843,048 B2
(45) Date of Patent: Nov. 30, 2010

(54) MULTI-CHIP DISCRETE DEVICES IN SEMICONDUCTOR PACKAGES

(75) Inventors: Manolito Galera, Singapore (SG); Leocadio Morona Alabin, Singapore (SG)

(73) Assignee: Fairchild Semiconductor Corporation DE (US)

( * ) Notice: Subject to any disclaimer, the term of this patent is extended or adjusted under 35 U.S.C. 154(b) by 47 days.

(21) Appl. No.: 12/115,049

(22) Filed: May 5, 2008

(65) Prior Publication Data

US 2009/0273067 A1 Nov. 5, 2009

(51) Int. Cl.
*H01L 23/02* (2006.01)
(52) U.S. Cl. ............... 257/678; 257/685; 257/E23.003; 257/E21.505; 257/676; 257/787
(58) Field of Classification Search ................ 257/685, 257/687, 723, E25.003, E25.005; 438/107, 438/125, 126
See application file for complete search history.

(56) References Cited

U.S. PATENT DOCUMENTS

| | | | |
|---|---|---|---|
| 6,040,626 A | 3/2000 | Cheah et al. | |
| 6,465,276 B2 | 10/2002 | Kuo | |
| 7,042,086 B2* | 5/2006 | Shimoida et al. | 257/724 |
| 2004/0089934 A1* | 5/2004 | Shimoida et al. | 257/686 |
| 2007/0228534 A1* | 10/2007 | Uno et al. | 257/678 |
| 2008/0122113 A1* | 5/2008 | Corisis et al. | 257/777 |
| 2008/0150100 A1* | 6/2008 | Hung et al. | 257/667 |
| 2008/0217765 A1* | 9/2008 | Yoder et al. | 257/723 |

OTHER PUBLICATIONS

U.S. Appl. No. 11/869,307.

* cited by examiner

*Primary Examiner*—N Drew Richards
*Assistant Examiner*—Mamadou Diallo
(74) *Attorney, Agent, or Firm*—Kirton & McConkie; Kenneth E. Horton

(57) ABSTRACT

Semiconductor packages that contain multiple dies containing discrete devices and methods for making such devices are described. The semiconductor package contains both a first die containing transistor and second die containing a diode. The interconnect lead of the semiconductor package is connected to the bond pad of the transistor. At the same time, the interconnect lead contains a die attach pad for the diode. The result of this configuration is an integrated functional semiconductor device with a diminished footprint and decreased cost of manufacture. By using more than a single die containing a discrete device in a single semiconductor package, the device can also provide a wider variety of functions. Other embodiments are also described.

25 Claims, 4 Drawing Sheets

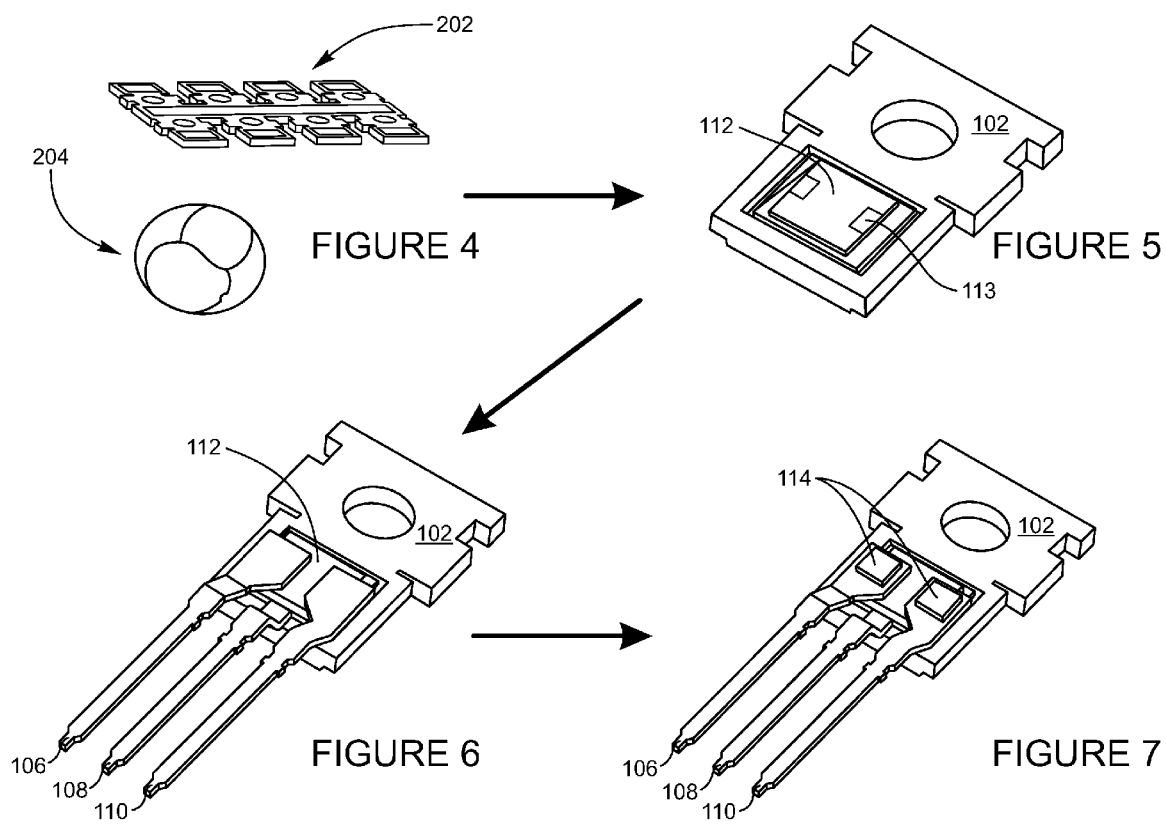

MULTI-CHIP DISCRETE DEVICES IN SEMICONDUCTOR PACKAGES

FIELD

This application relates generally to semiconductor devices and methods for making such devices. More specifically, this application describes semiconductor packages that contain multiple discrete devices and methods for making such devices.

BACKGROUND

Semiconductor packages are well known in the art. Often, these packages may include one or more semiconductor devices, such as an integrated circuit ("IC") die or chip, which may be connected to a die pad that is centrally formed in a lead frame. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

In most instances, each semiconductor package only contains a single die that contains the discrete device, such as a diode or a transistor. Thus, the functionality of each semiconductor package is often limited to that discrete device on the single die that it contains. To combine the functions of discrete devices in more than a single die, two semiconductor packages are needed. But this combination requires a larger footprint on the PCB.

SUMMARY

This application relates to semiconductor packages that contain multiple dies containing discrete devices and methods for making such devices. The semiconductor package contains both a first die containing transistor and second die containing a diode. The interconnect lead of the semiconductor package is connected to the bond pad of the transistor. At the same time, the interconnect lead contains a die attach pad for the diode. The result of this configuration is an integrated functional semiconductor device with a diminished footprint and decreased cost of manufacture. By using more than a single die containing a discrete device in a single semiconductor package, the device can also provide a wider variety of functions.

BRIEF DESCRIPTION OF THE DRAWINGS

The following description can be better understood in light of the Figures, in which:

FIGS. 4-7 depict some embodiments of the methods for manufacturing a semiconductor package containing multiple dies with discrete devices.

Figure 1:
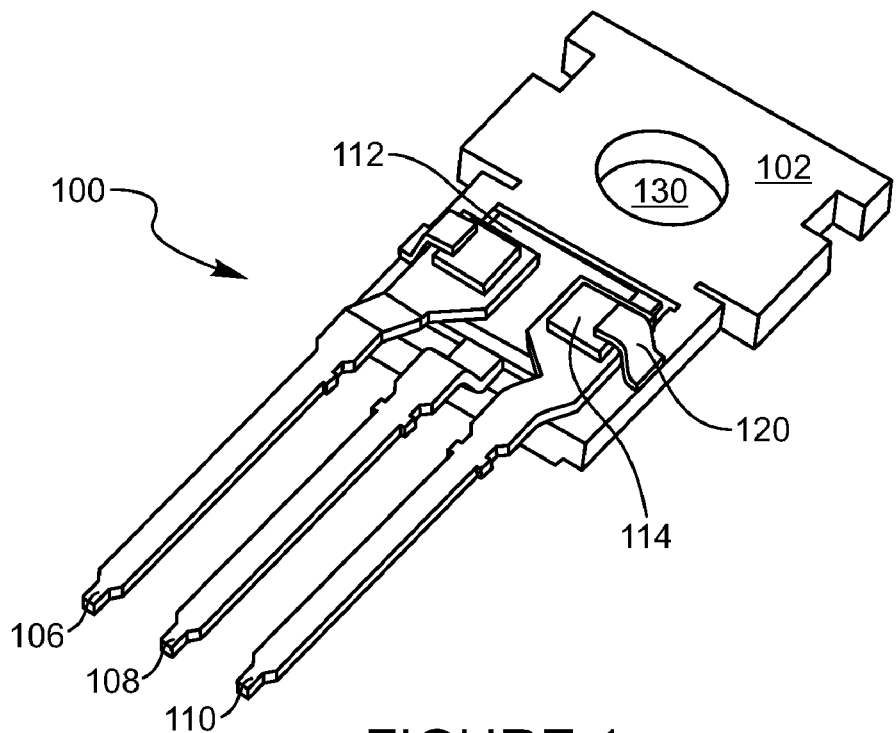
FIG. 1 shows some embodiments of a semiconductor device containing multiple die with discrete devices without packaging.

The Figures illustrate specific aspects of the semiconductor packages that contain multiple dies with discrete devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used for and applied to other electronic devices like optoelectronic devices, solar cells, MEMS structures, lighting controls, power supplies, and amplifiers. As well, while the description below describes using two dies with discrete devices in the same semiconductor package, it could be configured to contain more than two, including 3.

Some embodiments of the semiconductor packages that contain multiple dies with discrete devices and methods for making such devices are shown in the Figures. In the embodiments shown in FIG. 1 (shown without packaging) and FIG. 2 (shown with packaging), the semiconductor package 100 contains a plurality of leads 106, 108 and 110, a first die 112 containing a first discrete device, a second die 114 containing a second discrete device, connectors 120, and a die attach paddle 102. The semiconductor package 100 may be mounted to a surface (not shown) by passing a screw or other appropriate connector (not shown) through mounting hole 130.

The first discrete device and the second discrete device may be the same or different any may be any known in the art. Some non-limiting examples of these discrete devices may include diodes and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET"). In some embodiments, the first discrete device comprises a transistor, such as a BJT, and the second discrete device comprises a diode.

The semiconductor package 100 also contains a die attach paddle (or DAP) 102 on which the other components of the semiconductor device are located. Any DAP known in the art can be used, such as one that is made of an electrically and thermally conductive material, including Cu, Au, Ni, Pd, and combinations thereof. In some embodiments, the DAP 102 comprises Cu. Thus, the DAP can also serve as a heat sink for the heat generated by the discrete devices during operation.

The DAP 102 can be configured with any shape and size consistent with its use in the semiconductor package 100. The DAP 102 can have any thickness that provides the needed support for the device. In some embodiments, such as where the DAP 102 comprises Cu, it may have a thickness ranging from about 0.5 millimeters to about 1.4 millimeters.

In some embodiments, the DAP 102 has the shape illustrated in the Figures since it contains a die pad area 107 (see FIG. 3) to which the bottom of the first die 112 is connected. Due to the overlap of the surfaces of the die attach pad 107 and the first die 112, the die pad 107 can act as both a thermal and/or an electrical conductor. Such a configuration also permits the leads to dissipate the heat generated by the discrete device, increasing the efficiency of the heat dissipation from the semiconductor package 100.

The leads extend away from the semiconductor package 100 and are used to electrically connect the first and second discrete devices of the semiconductor package 100 to an external device, such as a PCB or PWB (Printed Wiring Board). In the embodiments shown in FIGS. 1 and 2, the semiconductor package 100 contains 3 leads designated by 106, 108, and 110. In other embodiments, though, the semiconductor package 100 can contain fewer leads (i.e., 2) or more leads (i.e., 4 or more).

Figure 2:
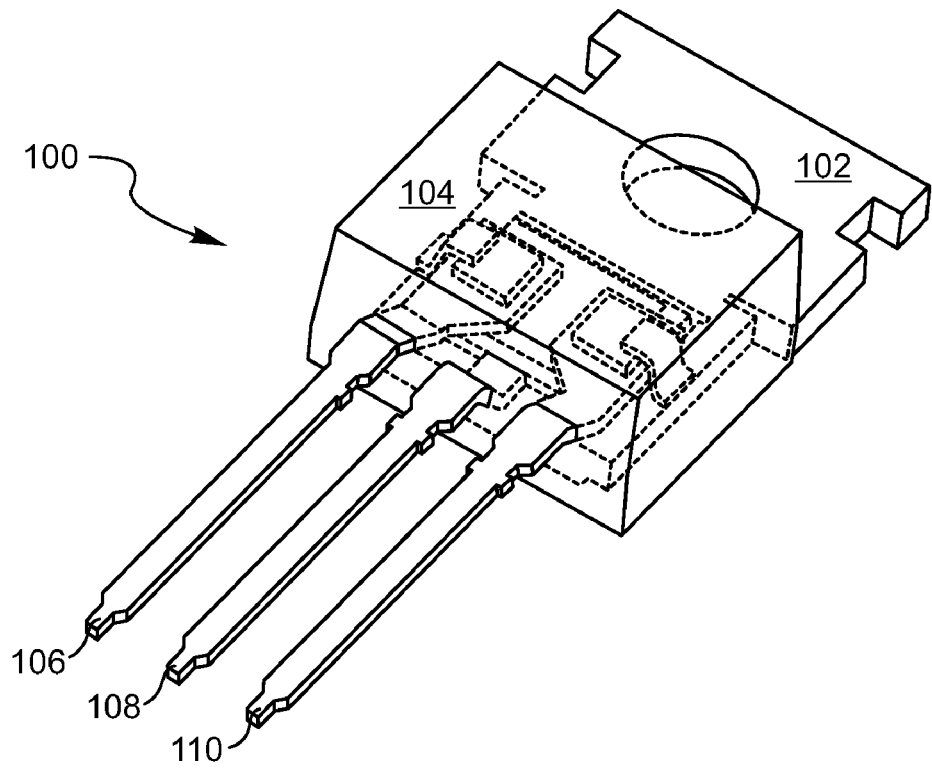
FIG. 2 shows some embodiments of a packaged semiconductor device (or semiconductor package) containing multiple dies with discrete devices.

The leads can be made of any material and have any configuration known in the art. In the embodiments shown in the Figures, the leads are made of an electrically conductive material like copper or iron based alloy. The leads 106 and 110 are configured substantially the same. These two leads are configured so that the end proximate the package 100 can be located between the first and second dies and operate as described herein. Lead 108 is configured so that its proximate end can be connected to the end of the DAP 102, as shown in FIGS. 1 and 2. The other ends of the leads are given any configuration so that their terminals can be connected to the desired external device (i.e., PCB).

The semiconductor package 100 also contains connectors. In some embodiments, the connectors can be used to mechanically clip the second die (and therefore the proximate ends of leads 106 and 110) to the DAP 102. In other embodiments, the connectors can be used to electrically connect the second discrete device to either the DAP 102 or to another lead. The configuration of the connectors will accordingly depend on the shape and size of these components. In some embodiments, the connectors given the configuration depicted by 120 in FIGS. 1 and 2.

The first and second dies, the die pad 107, the proximate ends of the leads, and the connectors 120 can be encapsulated in any molding material 104 known in the art, as shown in FIG. 2. In some embodiments, the molding material 104 can comprise an epoxy molding compound, a thermoset resin, a thermoplastic material, or potting material. In other embodiments, the molding material comprises an epoxy molding compound. In the Figures, the molding material 104 is shown in phantom to better illustrate the internal components of semiconductor package 100.

Figure 3:
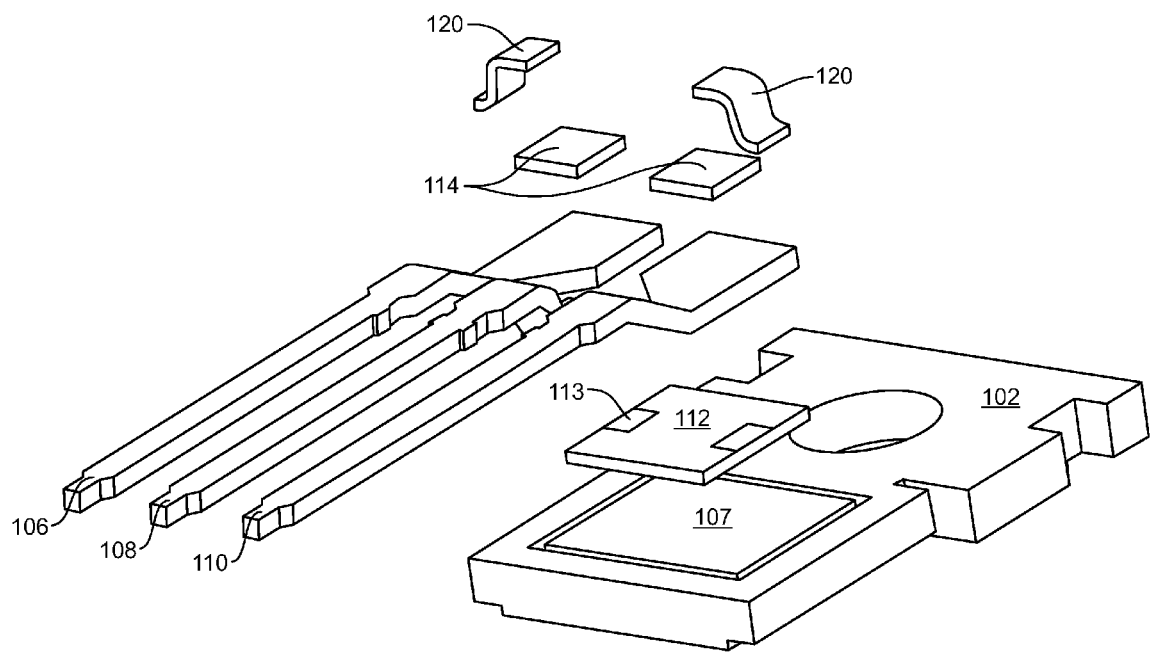
FIG. 3 illustrates an exploded view of some embodiments of a semiconductor package containing multiple dies with discrete devices.

FIG. 3 shows an exploded view of these components and illustrates how they are interconnected within the semiconductor package 100. The first die 112 is located on the die pad 107 of the DAP 102. The first discrete device of the first die 112 contains bond pads 113 on the upper surface of the die. The bottom surface of the proximate ends of the leads 106 and 110 can be connected to these bonds pads 113. The upper surface of the proximate ends of the leads 106 and 110 can then be configured to contain a die attach pad for the second die 114 containing the second discrete devices. The connectors 120 are then used to clip and/or connect the second die 114 containing the second discrete device to the DAP 102, at the same time thereby holding the proximate ends of the leads 106 and 110, as well as the first die 112, to the DAP 102. The result of this configuration is that an integrated functional device is formed so that, in some embodiments, the transistor acts like a switch or amplifier and the diode protects the transistor from ESD or transient voltages and also stabilizes the output response.

The semiconductor package 100 can be manufactured using any process that provides the structures illustrated in FIGS. 1-3. In some embodiments, the following method is used to manufacture the semiconductor package 100. The method begins, as illustrated in FIG. 4, by providing the DAP 102. The DAP is typically provided by providing metal stamping or etching a frame 202 to contain multiple DAP 102 with the desired shapes that are connected by tie bars. Each of the individual DAPs can be separated from the tie bars (after the package 100 has been formed) and used for a separate semiconductor package.

Next, or at the same time, the first and second dies containing their discrete devices are manufactured using any known processes. In some embodiments, the first and second discrete devices can be manufactured separately in the first and second dies. But in other embodiments, the first and second discrete devices are manufactured in their respective dies at the same time. During this processing, the first discrete device (i.e., the transistor) is provided with bond pads 113 using any processes known in the art.

As shown in FIG. 5, the first die 112 containing the first discrete device is then attached to the DAP 102 using any known process. One example of these processes include solder bumping, which may include the use of solder bumps, balls, studs, and combinations thereof along with a solder paste, followed by a cure and reflow process. Another example of these processes includes the use of a conductive adhesive between the DAP 102 and the first discrete device. The conductive adhesive may be, for example, a conductive epoxy, a conductive film, a screen printable solder paste, or a solder material, such as a lead-containing solder or a lead-free solder. In some embodiments, this attachment is performed by using soft solder method wherein a thick solder wire is melted to the DAP prior to die attachment.

Next, as shown in FIG. 6, the leads 106, 108, and 110 are attached to the structure illustrated in FIG. 5. In this process, the bottom of the leads 106 and 110 are attached to the bonds pads 113 of the first discrete device and the lead 108 is attached the DAP 102 using any known process or combination of processes. One example of these processes include solder bumping, which may include the use of solder bumps, balls, studs, and combinations thereof along with a solder paste, followed by a cure and reflow process. Another example of these processes includes the use of a conductive adhesive. The conductive adhesive may be, for example, a conductive epoxy, conductive film, screen printable solder paste, or a solder material, such as a lead-containing solder or a lead-free solder. In some embodiments, the leads 106 and 110 are attached by using screen printed or dispensed solder paste and the lead 108 is attached by solder paste or pre-deposited solder.

Next, as shown in FIG. 7, the second die 114 containing the second discrete device is attached to the upper surface of the leads 106 and 110 using any known process. In this process, the upper surface of the leads 106 and 110 have been configured to serve as a die attach pad for the second discrete device. One example of the attachment processes include solder bumping, which may include the use of solder bumps, balls, studs, and combinations thereof along with a solder paste, followed by a cure and reflow process. Another example of these processes includes the use of a conductive adhesive. The conductive adhesive may be, for example, a conductive epoxy, conductive film, screen printable solder paste, or a solder material, such as a lead-containing solder or a lead-free solder. In some embodiments, the second discrete device 114 is attached to the leads 106 and 110 by using a conductive film or solder paste.

Figure 8:
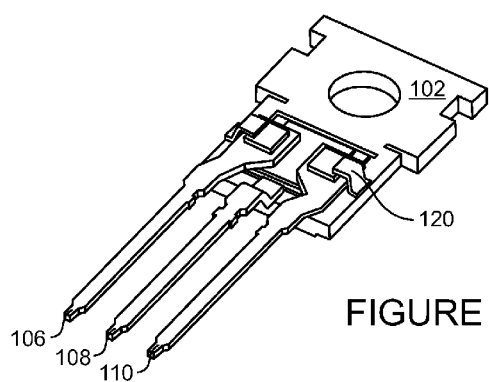
FIGS. 8-11 illustrate various connections used in different embodiments of semiconductor packages containing multiple dies with discrete devices.

The process continues when the connectors are attached to the second discrete device 114 and also to the DAP 102. In some embodiments, the connectors are attached using the configuration shown in FIG. 8 as connector 120 so that the resulting device operates as an amplifier, comparator, or the like where one diode protects the transistor from saturation and stabilize output response and the other diode protect the transistor from ESD or transient voltages. The connectors 120 can be attached using any known process, including common copper clip attach using solder paste.

Figure 9:
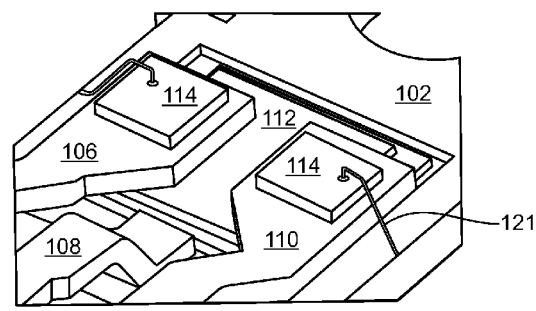

In other embodiments, different connectors can be used instead of connectors 120. In these embodiments, which are illustrated in FIG. 9, the connectors comprise wire bonds 121 that are used to connect the second discrete device 114 and the DAP 102. Any know wire bonding process can be used to form the wire bonds 121.

Figure 10:
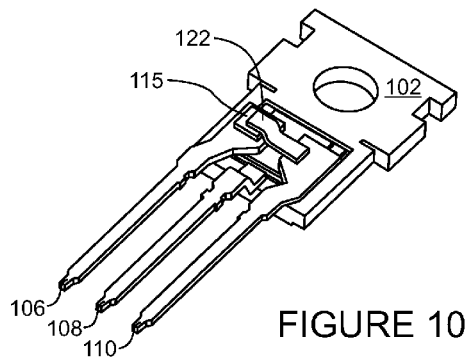

In yet other embodiments, the connectors and the second discrete device are configured as depicted in FIG. 10. In these embodiments, the second discrete device 115 (which may be the same or different than second discrete device 114) comprises a diode with an upper side containing an anode. The anode is connected to one end of the connector 122, with the other end of the connector 122 being connected to lead 110. In such a configuration, the resulting device can operate as a compact device for any fluorescent lighting application. The connector 122 can be attached using any known process, including any of those described previously.

Figure 11:
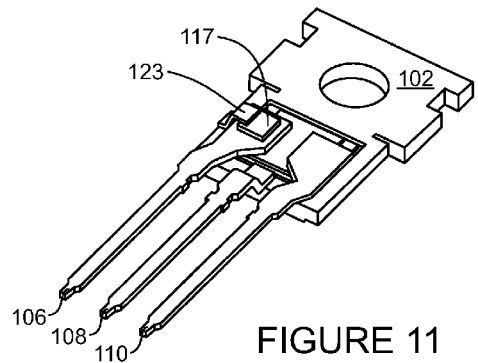

In still other embodiments, the connectors and the second discrete device are configured as depicted in FIG. 11. In this configuration, the second discrete device 117 (which may be the same or different than second discrete device 114) comprises a diode with an upper surface containing a cathode. The cathode is connected to one end of the connector 123, with the other end of the connector 123 being connected to the DAP 102. In such a configuration, the resulting device can operate as an integrated device for any switching power supply application. The connector 123 can be attached using any known process, including any of those described previously.

Once the connectors have been formed, the molding material 104 is then formed around the die pad 107, first and second dies, proximate ends of the leads, and the connectors by any known encapsulation process, including potting, transfer molding, or injection. The resulting semiconductor package (such as that illustrated in FIG. 2) is then optionally marked, trimmed, formed, and singulated using processes known in the art.

The semiconductor packages formed from this process contain two dies with discrete devices that are interconnected by leads located between the devices. The interconnect lead is connected to the bond pad of the discrete device located under it and, at the same time, operates as a die attach pad for the discrete device located over it. The two discrete devices can be given different configurations within the package to obtain the desired function for the semiconductor device. Thus, the semiconductor package has a diminished footprint and decreased cost of manufacture when compared to two semiconductor packages that each contains an individual die with the respective discrete device.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor package, comprising:
    a first die containing a first discrete device with a first bond pad on a first surface, the second surface of the first die connected to a first die attach pad;
    a first lead of a leadframe, the first lead having a first end proximate the first die and a second end distal from the first die with a bottom surface of the first end connected to the first bond pad, and the upper surface of the first end of the first lead forming a second die attach pad;
    a second die containing a second discrete device connected to the second die attach pad;
    a connector attached to the second discrete device that mechanically clips that second die to the first die attach pad; and
    a molding material encapsulating the connector, the first and second dies, and the first end of the first lead without encapsulating the second end of the first lead.

2. The semiconductor package of claim 1, wherein the first and second discrete devices are different.

3. The semiconductor package of claim 2, wherein the first discrete device comprises a transistor and the second discrete device comprises a diode.

4. The semiconductor package of claim 3, wherein the first discrete device comprises a bipolar junction transistor.

5. The semiconductor package of claim 1, wherein the first die attach pad is part of a die attach paddle.

6. The semiconductor package of claim 4, wherein the connector also mechanically clips the second discrete device to the die attach paddle.

7. The semiconductor package of claim 4, wherein the connector also mechanically clips the second discrete device to a second lead.

8. The semiconductor package of claim 1, further comprising a second lead having a first end proximate the first die and a second end distal from the first die with a bottom surface of the first end connected to the first discrete device via a second bond pad on the first surface of the first discrete device, the upper surface of the first end of the second lead forming a third die attach pad and the second discrete device being connected to the third die attach pad.

9. The semiconductor package of claim 8, wherein the molding material encapsulates the first end of the second lead without encapsulating the second end of the second lead.

10. A semiconductor package, comprising:
- a first die comprising a transistor containing a first bond pad on a first surface, the second surface of the first die connected to a first die attach pad of a die paddle;
- a first lead of a lead frame with an inner part proximate the first die and an outer part distal from the first die, the inner part with a bottom surface connected to the first bond pad, the upper surface of the inner part of the first lead forming a second die attach pad;
- a second die comprising a diode connected to the second die attach pad;
- a connector attached to the diode; and
- a molding material encapsulating the inner part of the first lead without encapsulating the outer part of the first lead.

11. The semiconductor package of claim 10, wherein the transistor comprises a bipolar junction transistor.

12. The semiconductor package of claim 10, wherein the connector mechanically attaches the cathode of the diode to the die attach paddle.

13. The semiconductor package of claim 10, wherein the connector mechanically attaches the anode of the diode to a second lead with a bottom surface connected to the transistor via a second bond pad on the first surface.

14. The semiconductor package of claim 10, further comprising a second lead of the lead frame with an inner part proximate the first die and an outer part distal from the first die, the inner part of the second lead with a bottom surface connected to the transistor via a second bond pad on the first surface and the upper surface of the inner part of the second lead forming a third die attach pad and the diode being connected to the third die attach pad.

15. The semiconductor package of claim 14, wherein the molding material also encapsulates the connector, the transistor and the diode, and the inner part of the second lead without encapsulating any surface of the outer part of the second lead.

16. A method for making a semiconductor package, comprising:
- providing a first die comprising a first discrete device containing a first bond pad on a first surface;
- connecting the second surface of the first die to a first die attach pad;
- connecting a bottom surface of a first end of a first lead of a leadframe to the first bond pad, wherein the upper surface of the first end of the first lead comprises a second die attach pad and wherein the first end is proximate the first die and the first lead also contains a second end distal from the first die;
- connecting a second die containing a second discrete device to the second die attach pad;
- attaching a connector to the second discrete device so that the connector mechanically clips the second die to the first die attach pad;
- encapsulating a molding material around the connector, the first and second dies, and the first end of the first lead without encapsulating the second end of the first lead.

17. The method of claim 16, wherein the first discrete device comprises a transistor and the second discrete device comprises a diode.

18. The method of claim 17, wherein the first discrete device comprises a bipolar junction transistor.

19. The method of claim 16, wherein the first die attach pad is part of a die attach paddle.

20. The method of claim 16, wherein the connector also mechanically clips the second discrete device to the die attach paddle.

21. The method of claim 16, wherein the connector also mechanically clips the second discrete device to a second lead having a first end proximate the first die and a second end distal from the first die.

22. The method of claim 21, further comprising:
- connecting a bottom surface of the second lead to the first discrete device via a second bond pad on the first surface, wherein the upper surface of the second lead comprises a third die attach pad; and
- connecting the second discrete device to the third die attach pad.

23. The method of claim 22, wherein the molding material encapsulates the first end of the second lead without encapsulating the second end of the second lead.

24. A method for making a semiconductor package, comprising:
- providing a first die comprising a transistor containing a first bond pad on a first surface;
- connecting the second surface of the die to a first die attach pad of a die paddle;
- connecting a first lead of a lead frame to the first bond pad, wherein the first lead contains an inner part proximate the first die and an outer part distal from the first die, the inner part with a bottom surface connected to the first bond pad and the upper surface of the inner part of the first lead forming a second die attach pad;
- connecting a second die comprising a diode to the second die attach pad;
- attaching a connector to the diode; and
- encapsulating a molding material to enclose the inner part of the first lead without encapsulating the bottom surface or the upper surface of the outer part of the first lead.

25. The method of claim 24, further comprising:
- providing a second lead of the lead frame with an inner part proximate the first die and an outer part distal from the first die;
- connecting a bottom surface of the second lead to the first die via a second bond pad on the upper surface of the first die, wherein the upper surface of the second lead comprises a third die attach pad;
- connecting the second die to the third die attach pad; and
- encapsulating the molding material to enclose the connector, the transistor, the diode, and all surfaces of the inner part of a second lead without encapsulating any surface of the outer part of the second lead.

* * * * *